United States Patent
Arai et al.

(10) Patent No.: US 7,116,039 B2
(45) Date of Patent: Oct. 3, 2006

(54) CRYSTAL UNIT AND HOLDING STRUCTURE OF CRYSTAL UNIT

(75) Inventors: Masaaki Arai, Saitama (JP); Seiji Oda, Saitama (JP); Mitoshi Umeki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 145 days.

(21) Appl. No.: 10/645,968

(22) Filed: Aug. 22, 2003

(65) Prior Publication Data

US 2004/0135471 A1    Jul. 15, 2004

(30) Foreign Application Priority Data

Aug. 22, 2002   (JP)   ............... 2002-242148

(51) Int. Cl.
  *H01L 41/053*   (2006.01)
(52) U.S. Cl. ...................... 310/341; 310/348
(58) Field of Classification Search ............... 310/312, 310/320, 348, 352–354, 341
  See application file for complete search history.

(56) References Cited

U.S. PATENT DOCUMENTS 5,218,328 A * 6/1993 Morita et al. ............... 333/187
6,518,688 B1 * 2/2003 Sasaki ......................... 310/320

FOREIGN PATENT DOCUMENTS

| GB | 2202989 A | * | 4/1987 | |
| JP | 55-78617 | * | 6/1980 | ................. 333/187 |
| JP | 56083865 | * | 7/1981 | |
| JP | 10154919 | * | 6/1990 | |
| JP | 4-35107 | * | 2/1992 | ................. 333/190 |
| JP | 2000-278080 | * | 10/2000 | |
| JP | 2001-119264 | * | 4/2001 | |
| JP | 2001-185954 | * | 7/2001 | |
| JP | 2001-237665 | * | 8/2001 | |
| JP | 2003-8387 | * | 1/2003 | |
| JP | 2004-96163 | * | 3/2004 | |
| JP | 2004-254160 | * | 9/2004 | |
| JP | 2004-254160 A | * | 9/2004 | |
| JP | 2005-51513 A | * | 2/2005 | |

* cited by examiner

*Primary Examiner*—Thomas M. Dougherty
(74) *Attorney, Agent, or Firm*—Muirhead & Saturnelli, LLC

(57) ABSTRACT

A high-frequency quartz crystal unit includes a quartz crystal blank having a hole defined in at least one principal surface thereof, providing a resonating region in a portion of the crystal blank which is made thinner by the hole, excitation electrodes disposed respectively on opposite principal surfaces of the crystal blank in the resonating region, extension electrodes extending respectively from the excitation electrodes to respective first and second positions on an outer peripheral portion of the crystal blank, and a casing. The crystal blank has a fixed end electrically and mechanically connected to the casing by eutectic alloy in the first position. The crystal blank has a free end on which the extension electrodes are electrically connected to the casing by wire bonding in the second position.

12 Claims, 4 Drawing Sheets

CRYSTAL UNIT AND HOLDING STRUCTURE OF CRYSTAL UNIT

BACKGROUND OF THE INVENTION

1. Field of the Invention

The present invention relates to a quartz crystal unit having a high vibration frequency of 100 MHz or higher, and more particularly to a crystal unit having good aging characteristics and oscillating characteristics and a holding structure of such a crystal unit.

2. Description of the Related Art

Crystal units having a quartz crystal blank housed in a casing are incorporated as a frequency control device, particularly a reference source of a communication frequency, in oscillators. In recent years, with the advent of optical communication systems, there have been demands for crystal units having higher vibration frequencies. To meet such demands, a crystal unit has been developed which has a recess defined in a resonating region of a crystal blank to reduce the thickness of the crystal blank in the recess for increasing the resonant frequency, and holds the resonating region with a relatively thick portion around the recess to provide desired mechanical strength.

FIG. 1 shows a conventional crystal unit of such a design in exploded perspective. As shown in FIG. 1, the conventional crystal unit comprises casing 5 made of laminated ceramics and having a recess defined therein, and crystal blank 2 accommodated in the recess in casing 5. Casing 5 is in the form of a substantially rectangular parallelepiped, and crystal blank 2 is of a substantially rectangular shape. A step is formed on one of side surfaces of the recess in casing 5. A pair of connecting terminals 7 is disposed on the upper surface of the step at its opposite ends for electrically connecting to crystal blank 2. A pair of mounting terminals (not shown) is disposed on the outer surface of casing 5 and used to surface-mount the crystal unit on a wiring board. The mounting terminals are electrically connected to connecting terminals 7 through via holes or the like that are defined in casing 5.

Structural details of crystal blank 2 are shown in FIGS. 2A and 2B. Crystal blank 2 typically comprises an AT-cut quartz crystal blank. The AT-cut quartz crystal blank has its resonant frequency determined depending on the thickness thereof. The resonant frequency of the AT-cut quartz crystal blank is higher as the thickness thereof is smaller. To enable crystal blank 2 to have a resonant frequency in excess of 100 MHz, hole portion 1 is defined centrally in one principal surface of crystal blank 2, making crystal blank 2 thinner at the bottom of hole portion 1 than at a portion around hole portion 1 with the thinner region serving as a vibrating region. In the vibrating region, excitation electrodes 3 are disposed respectively on the principal surfaces of crystal blank 2. Extension electrodes 4 extend respectively from excitation electrodes 3 toward respective opposite areas of a shorter side of crystal blank 2. Extension electrodes 4 are associated respectively with connecting terminals 7 on the step of casing 5. Extension electrode 4 which is disposed on the upper surface of crystal blank 2 as shown has its tip end folded back over the lower surface of crystal blank 2 as shown across the shorter side of crystal blank 2. The both ends of the shorter side of crystal blank 2 is fixed to connecting terminals 7 by electrically conductive adhesive 6, thus holding crystal blank 2 horizontally in the recess in casing 5 and electrically connecting extension electrodes 4 to connecting terminals 7. Therefore, the mounting terminals disposed on the outer surface of casing 5 are electrically connected to excitation electrodes 3 of crystal blank 2.

After crystal blank 2 is fixed to the step in the recess in casing 5, a cover (not shown) is placed on casing 5 to seal the opening of the recess, thus hermetically sealing crystal blank 2 in casing 5.

The crystal unit of the above structure has suffered the following problems because of crystal blank 2 being fixed in position by electrically conductive adhesive 6: Electrically conductive adhesive 6 comprises a polymer resin such as silicone or epoxy resin mixed with metal particles. When electrically conductive adhesive 6 is hardened with heat, it bonds crystal blank 2 to casing 5. When electrically conductive adhesive 6 is thermoset, it emits an organic gas that is attached to crystal blank 2. An organic gas component that remains unremoved by cleaning or the like will subsequently be released and attached again to the vibrating region of crystal blank 2. When the assembly is exposed to a high temperature after crystal blank 2 is hermetically sealed in casing 5, electrically conductive adhesive 6 also emits an organic gas that will subsequently be attached to the vibrating region of crystal blank 2. If the organic gas component is attached to the vibrating region of crystal blank 2, the vibration frequency of crystal blank 2 or the like changes due to the mass addition effect or the like of the organic gas component, impairing the aging characteristics of the crystal unit. The higher the vibration frequency of crystal blank 2, the smaller the thickness of the vibrating region. Thus, if the vibration frequency of crystal blank 2 is higher, then the organic gas component that is attached to the vibrating region of crystal blank 2 is more detrimental to the aging characteristics of the crystal unit.

One solution would be to use a eutectic alloy having a low melting point, e.g., an inorganic material of AuSn (gold-tin) alloy, as a joining material for fixing crystal blank 2 to casing 5, instead of electrically conductive adhesive 6. However, since the joint made by a eutectic alloy has a high bonding strength, crystal blank 2 is strained due to the difference between the coefficients of thermal expansion of crystal blank 2 and casing 5. FIGS. 3A and 3B show the manner in which crystal blank 2 is strained due to the difference between the coefficients of thermal expansion of crystal blank 2 and casing 5. As shown in FIGS. 3A and 3B, crystal blank 2 is bent under stresses applied between two outer peripheral points on crystal blank 2. The strain is propagated to the vibrating region of crystal blank 2, impairing the vibrating characteristics of crystal blank 2, in particular, frequency vs. temperature characteristics that will be represented by a cubic function curve if crystal blank 2 comprises an AT-cut quartz crystal blank.

If crystal blank 2 is held at its opposite ends, then it will be strained to a greater extent because the vibrating region is positioned between the opposite ends than if crystal blank 2 were held at opposite sides at one end thereof. If the vibration frequency of crystal blank 2 is higher, then since the thickness of the vibrating region is smaller, crystal blank 2 will be strained more greatly. Though crystal blank 2 is also strained if it is fixed in position by electrically conductive adhesive 6, it is trained to a much larger extent if the eutectic alloy is used as the joining material.

SUMMARY OF THE INVENTION

It is an object of the present invention to provide a high-frequency crystal unit which has good aging characteristics and vibrating characteristics.

Another object of the present invention is to provide a holding structure of a high-frequency crystal unit while allowing the high-frequency crystal unit to have good aging characteristics and vibrating characteristics.

According to the present invention, the former object can be achieved by a crystal unit comprising a crystal blank having a hole portion defined in at least one principal surface thereof, providing a vibrating region in a portion of the crystal blank which is made thinner by the hole portion, excitation electrodes disposed respectively on opposite principal surfaces of the crystal blank in the vibrating region, extension electrodes extending respectively from the excitation electrodes to respective first and second positions on an outer peripheral portion of the crystal blank, and a casing, wherein the crystal blank has a fixed end electrically and mechanically connected to the casing by eutectic alloy in the first position, the extension electrodes being electrically connected to the casing by wire bonding in the second position.

In one embodiment of the present invention, the crystal blank has a free end in the second position.

According to the present invention, the latter object can be achieved by a holding structure of a crystal unit having a hole portion defined in at least one principal surface thereof, providing a vibrating region in a portion of the crystal blank which is made thinner by the hole portion, the crystal blank supporting thereon excitation electrodes disposed respectively on opposite principal surfaces of the crystal blank in the vibrating region, and extension electrodes extending respectively from the excitation electrodes to respective first and second positions on an outer peripheral portion of the crystal blank, the crystal blank having a fixed end electrically and mechanically connected to a holder by eutectic alloy in the first position, the crystal blank having a free end on which wire bonding wires are connected to the extension electrodes in the second position.

With the above arrangement of the present invention, since the crystal blank is fixed in position without the need for an electrically conductive adhesive, no organic gas is emitted, and no organic gas component is attached to the crystal blank. Therefore, the crystal unit keeps its good aging characteristics. As the crystal blank is supported only at its fixed end in the first position on the outer peripheral portion of the crystal blank, the crystal blank is free of strains which would otherwise be caused by the difference between coefficients of thermal expansion of the crystal blank and the casing. Accordingly, the present invention provides a high-frequency crystal unit which has good aging characteristics and vibrating characteristics.

DETAILED DESCRIPTION OF THE INVENTION

Figure 1:
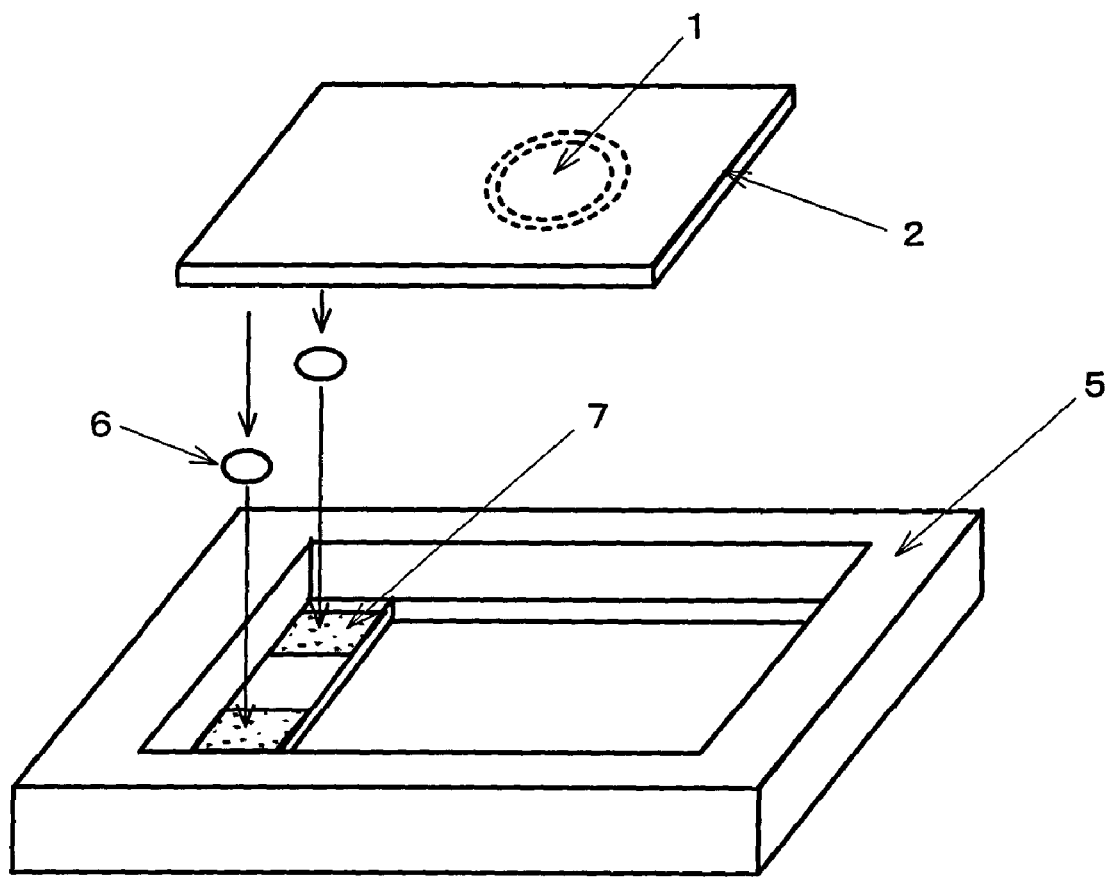
FIG. 1 is an exploded perspective view of a conventional crystal unit.
Figure 2A:
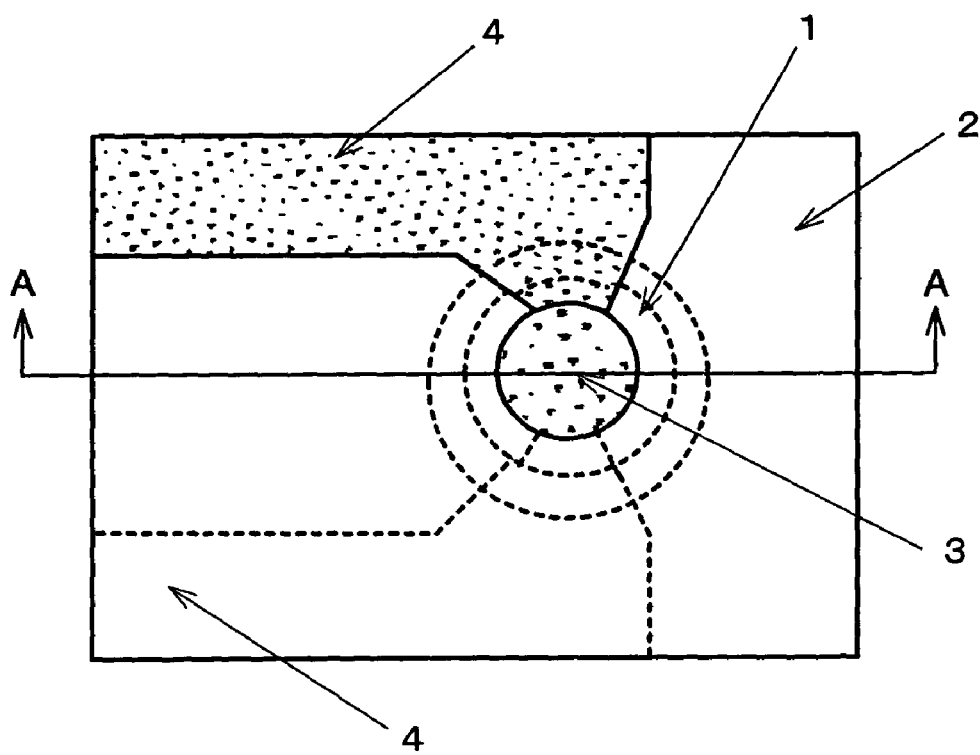
FIG. 2A is a plan view of a crystal blank in the conventional crystal unit.
Figure 2B:
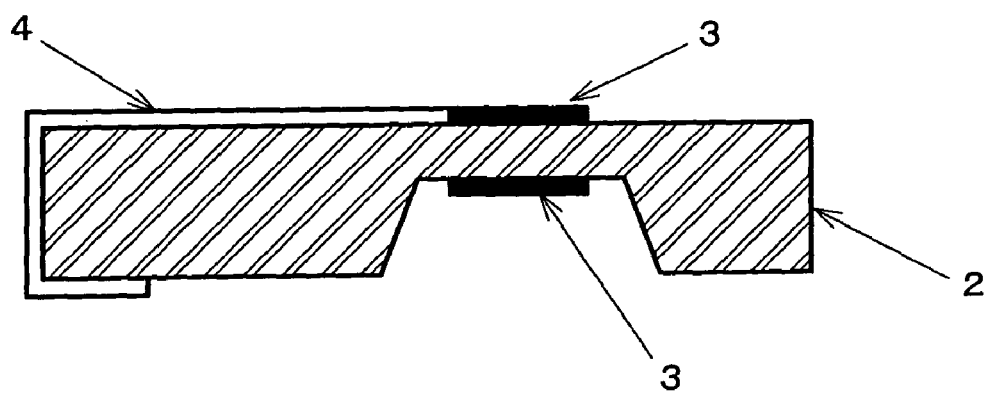
FIG. 2B is a cross-sectional view taken along line A—A of FIG. 2A.
Figure 3A:
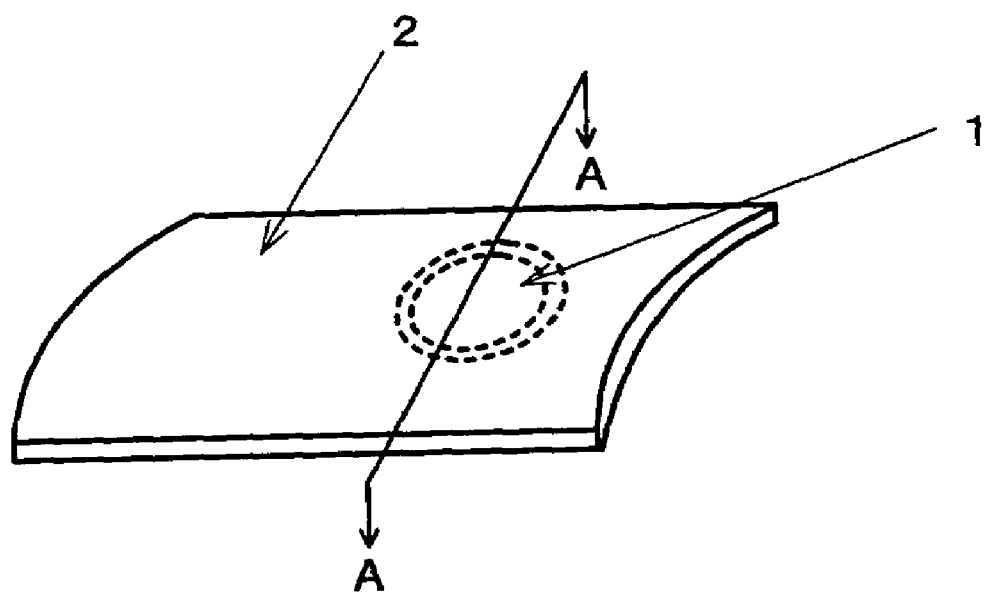
FIG. 3A is a perspective view of the crystal blank that is strained under stresses applied thereto.
Figure 3B:
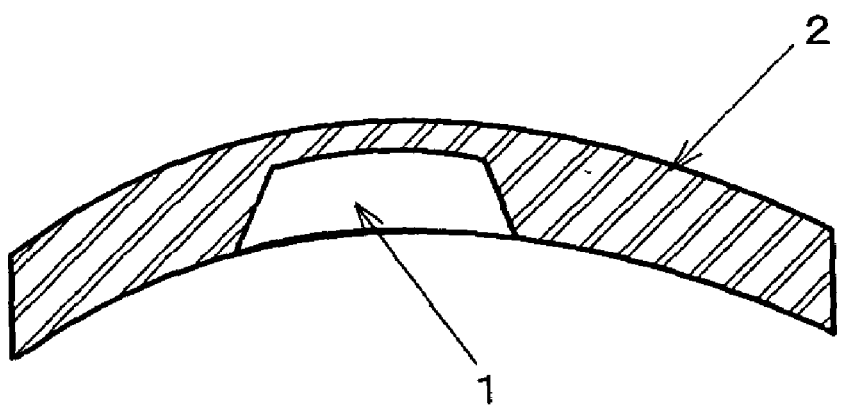
FIG. 3B is a cross-sectional view taken along line A—A of FIG. 3A.
Figure 4A:
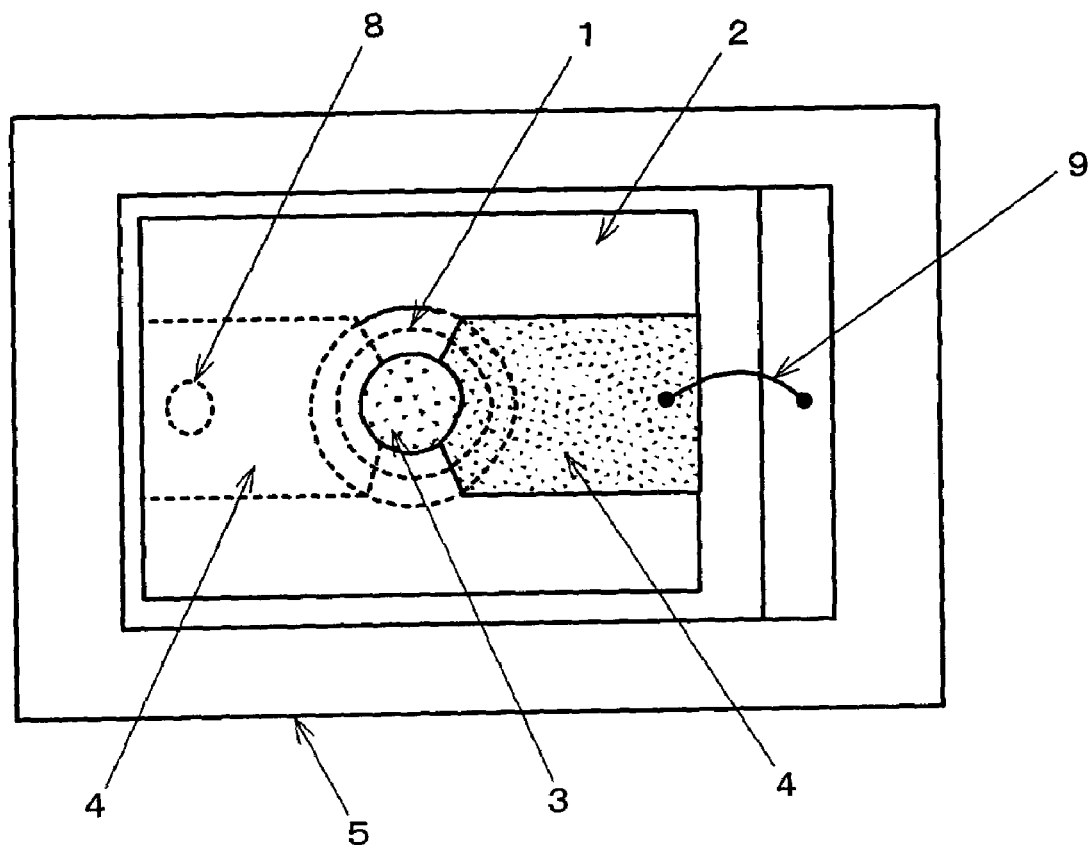
FIG. 4A is a plan view of a crystal unit according to an embodiment of the present invention, with a cover omitted from illustration.
Figure 4B:
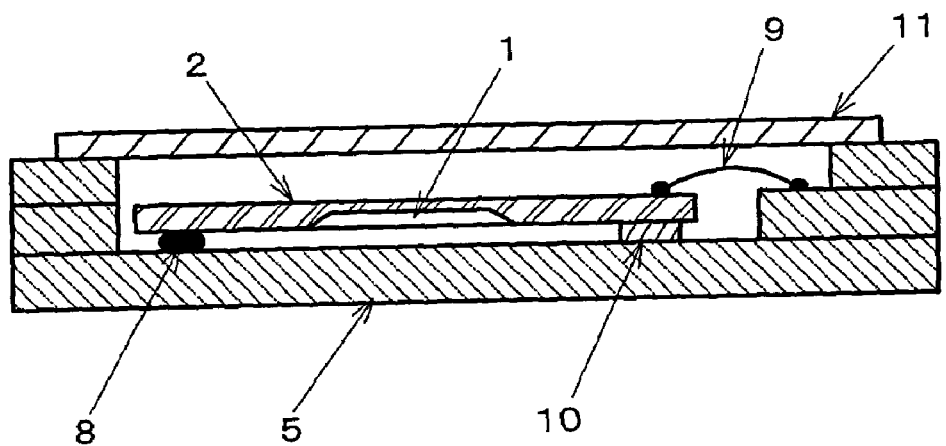
FIG. 4B is a cross-sectional view of the crystal unit shown in FIG. 4A with the cover attached thereto.

In FIGS. 4A and 4B which show a quartz crystal unit according to a preferred embodiment of the present invention, the constituent elements of the crystal unit which are identical to those of the conventional crystal unit shown in FIGS. 1A, 1B, and 2 are denoted by identical reference characters.

The crystal unit according to the present embodiment comprises quartz crystal blank 2 housed in a recess defined in casing 5 and cover 11 placed on casing 5 to hermetically seal crystal blank 2 in casing 5. Casing 5 functions as a member for holding crystal blank 2.

As shown in FIGS. 4A and 4B, crystal blank 2 comprises an AT-cut quartz crystal blank having a substantially rectangular planar shape, for example. Crystal blank 2 has substantially circular hole portion 1 defined centrally in one principal surface thereof. Crystal blank 2 has its thickness smaller at the bottom of hole portion 1 than outer peripheral portions thereof that are positioned outside of hole portion 1. The thinner portion of crystal blank 2 serves as a vibrating region thereof, and the resonant frequency of crystal blank 2 is determined by the thickness of the vibrating region of crystal blank 2.

The crystal unit has excitation electrodes 3 disposed respectively on the principal surfaces of the vibrating region and extension electrodes 4 extending respectively from excitation electrodes 3 toward outer peripheral edges of crystal blank 2 at its opposite ends. Crystal blank 2 is fixed to the bottom of the recess in casing 5 by eutectic alloy 8 of AuSn on the outer peripheral edge at one of the opposite ends of crystal blank 2. In the position where crystal blank 2 is fixed to the bottom of the recess in casing 5, one of extension electrodes 4 is electrically and mechanically connected to a circuit pattern disposed on the bottom of the recess in casing 5. The outer peripheral edge at the other of the opposite ends of crystal blank 2 is placed on a pillow member 10 formed on the bottom of the recess in casing 5. Crystal blank 2 is not fixed to pillow member 10. A side wall which defines the recess in casing 5 has a step near the other of the opposite ends of crystal blank 2, and a circuit pattern is disposed on an upper surface of the step. Other extension electrode 4 of crystal blank 2 is electrically connected to the circuit pattern on the step by wire bonding with gold wires 9. Specifically, substantially rectangular crystal blank 2 is fixed in position by eutectic alloy 8 nearly at a midpoint on one of shorter sides of substantially rectangular crystal blank 2, and electrically connected by wire bonding nearly at a midpoint on the other shorter side of substantially rectangular crystal blank 2.

Though not sown in the figure, a pair of mounting terminals is disposed on the outer surface of casing 5 and used to surface-mount the crystal unit on a wiring board. The mounting terminals are electrically connected to extension electrodes 4 of crystal blank 2 through via holes or the like that are defined in casing 5 and the circuit pattern referred to above.

With the above arrangement, crystal blank 2 has one fixed end joined to the bottom of the recess in casing 5 by eutectic alloy 8 and the other free end electrically connected by wire bonding. Even if casing 5 and crystal blank 2 have different coefficients of thermal expansion, no undue stresses occur between casing 5 and crystal blank 2 because crystal blank 2 has a free end opposite to the fixed end thereof. Therefore, crystal blank 2, particularly the vibrating region thereof, is free of strain, and hence maintains its good vibrating characteristics, particularly, frequency vs. temperature characteristics. As no electrically conductive adhesive is used to fix crystal blank 2 to casing 5, no organic gas component is emitted, allowing crystal blank 2 to maintain good aging characteristics.

Various changes and modifications may be made to the embodiment of the present invention which has been described above. In the illustrated embodiment, extension electrodes 4 extend toward the respective opposite ends of crystal blank 2. However, extension electrodes 4 may extend toward any two outer peripheral positions on crystal blank 2. For example, extension electrodes 4 may extend toward two locations on respective opposite sides on one end of crystal blank 2. In such a modification, one of the extension electrodes is fixed to the bottom of the recess in casing 5 by eutectic alloy 8 and connected to the circuit pattern, and the other extension electrode is connected to the circuit pattern by wire bonding.

The crystal blank in the illustrated embodiment has hole portion 1 defined in one principal surface thereof, providing the vibrating region. However, the crystal blank may have hole portions defined in the respective principal surfaces thereof, providing the vibrating region.

Eutectic alloy 8 by which to secure crystal blank 2 to the bottom of the recess in casing 5 may comprise AuGe (gold-germanium) alloy, AuSi (gold-silicon) alloy, or the like, rather than AuSn alloy. Basically, an inorganic material having a melting temperature lower than 573° C., which is the phase transition temperature of the quartz crystal, may be used to fix crystal blank 2 to casing 5.

What is claimed is:

1. A crystal unit, comprising:
   a crystal blank having a hole portion defined in at least one principal surface thereof, providing a vibrating region in a portion of the crystal blank which is made thinner by the hole portion;
   excitation electrodes disposed respectively on opposite principal surfaces of the crystal blank in said vibrating region;
   extension electrodes extending respectively from said excitation electrodes to respective first and second positions on an outer peripheral portion of said crystal blank;
   a casing; and
   a pillow member mounted on said casing,
   wherein said crystal blank has a single fixed end electrically and mechanically connected to said casing by eutectic alloy in said first position,
   wherein said crystal blank has a free end in said second position, said free end being placed on said pillow member, and
   wherein said extension electrodes are electrically connected to said casing by wire bonding in said second position.

2. The crystal unit according to claim 1, wherein said crystal blank comprises an AT-cut quartz crystal blank having a substantially rectangular planar shape, said first position is on an end of said AT-cut quartz crystal blank, and said second position is on another end of said AT-cut quartz crystal blank which is opposite to said end of said AT-cut quartz crystal blank.

3. The crystal unit according to claim 1, wherein said eutectic alloy comprises an alloy selected from the group consisting of AuSn, AuGe, and AuSi.

4. A structure for holding a crystal blank having a hole portion defined in at least one principal surface thereof, providing a vibrating region in a portion of the crystal blank which is made thinner by the hole portion;
   said crystal blank supporting thereon excitation electrodes disposed respectively on opposite principal surfaces of the crystal blank in said vibrating region, and extension electrodes extending respectively from said excitation electrodes to respective first and second positions on an outer peripheral portion of said crystal blank;
   said crystal blank having a single fixed end electrically and mechanically connected to a holder by eutectic alloy in said first position;
   said crystal blank having a free end on which wire bonding wires are connected to said extension electrodes in said second position, said free end being disposed on a pillow member mounted on the casing.

5. The holding structure according to claim 4, wherein said crystal blank comprises an AT-cut quartz crystal blank having a substantially rectangular planar shape.

6. The holding structure according to claim 5, wherein said first position is on an end of said AT-cut quartz crystal blank, and said second position is on another end of said AT-cut quartz crystal blank which is opposite to said end of said AT-cut quartz crystal blank.

7. The crystal unit according to claim 1, wherein said crystal blank operates at a frequency of 100 MHz or higher.

8. The holding structure according to claim 4, wherein said crystal blank operates at a frequency of 100 MHz or higher.

9. A crystal unit, comprising:
   a crystal blank having a hole portion defined in at least one principal surface thereof, providing a vibrating region in a portion of the crystal blank which is made thinner by the hole portion;
   excitation electrodes disposed respectively on opposite principal surfaces of the crystal blank in said vibrating region;
   extension electrodes extending respectively from said excitation electrodes to respective first and second positions on an outer peripheral portion of said crystal blank;
   a casing, wherein said crystal blank has a single fixed end electrically and mechanically connected to said casing by eutectic alloy in said first position; and
   a pillow member mounted on said casing, wherein said crystal blank has a free end in said second position, said free end being placed on said pillow member.

10. The crystal unit according to claim 9, wherein said extension electrodes are electrically connected to said casing by wire bonding in said second position.

11. The crystal unit according to claim 9, wherein said crystal blank comprises an AT-cut quartz crystal blank having a substantially rectangular planar shape, said first position is on an end of said AT-cut quartz crystal blank, and said second position is on another end of said AT-cut quartz crystal blank which is opposite to said end of said AT-cut quartz crystal blank.

12. The crystal unit according to claim 9, wherein said eutectic alloy comprises an alloy selected from the group consisting of AuSn, AuGe, and AuSi.

* * * * *